(12) United States Patent  
Strukov

(10) Patent No.: US 8,891,283 B2  
(45) Date of Patent: Nov. 18, 2014

(54) MEMRISTIVE DEVICE BASED ON CURRENT MODULATION BY TRAPPED CHARGES

(75) Inventor: Dmitri Strukov, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 238 days.

(21) Appl. No.: 13/130,820

(22) PCT Filed: Jan. 5, 2009

(86) PCT No.: PCT/US2009/030122  
§ 371 (c)(1),  
(2), (4) Date: May 24, 2011

(87) PCT Pub. No.: WO2010/077371  
PCT Pub. Date: Jul. 8, 2010

(65) Prior Publication Data  
US 2011/0228593 A1 Sep. 22, 2011

(51) Int. Cl.  
*G11C 11/00* (2006.01)  
*B82Y 10/00* (2011.01)  
*G11C 13/00* (2006.01)  
*H01L 27/10* (2006.01)  
*G11C 11/34* (2006.01)

(52) U.S. Cl.  
CPC ............ *H01L 27/10* (2013.01); *G11C 2213/77* (2013.01); *B82Y 10/00* (2013.01); *G11C 2213/33* (2013.01); *G11C 13/0002* (2013.01); *G11C 2213/15* (2013.01); *G11C 11/34* (2013.01); *G11C 2213/81* (2013.01)  
USPC .......................................................... 365/148

(58) Field of Classification Search  
None  
See application file for complete search history.

(56) References Cited

U.S. PATENT DOCUMENTS

| | | | | |
|---|---|---|---|---|
| 4,163,982 A | * | 8/1979 | Di Domenico et al. | ........ 361/435 |
| 6,114,099 A | * | 9/2000 | Liu et al. | ........ 430/324 |
| 6,855,950 B2 | * | 2/2005 | McCreery | ........ 257/40 |
| 7,141,299 B2 | * | 11/2006 | McCreery | ........ 428/333 |
| 7,203,789 B2 | | 4/2007 | Snider | |
| 7,737,433 B2 | * | 6/2010 | McCreery et al. | ........ 257/40 |
| 7,745,874 B2 | * | 6/2010 | Lee et al. | ........ 257/325 |
| 7,846,807 B2 | * | 12/2010 | Tang et al. | ........ 438/385 |

(Continued)

OTHER PUBLICATIONS

Sakamoto, Toshitsugu et al.; "Three Terminal Solid-Electrolyte Nanometer Switch": Electron Devices Meeting, 2005, IEDM Technical Digest. IEEE International; Dec. 2005; 475-478; IEEE; USA.

(Continued)

*Primary Examiner* — Kretelia Graham

(57) ABSTRACT

A memristive device includes a first electrode; a second electrode; a junction between the first electrode and the second electrode, the junction including a semiconductor matrix and particles embedded in the semiconductor matrix, the particles being configured to hold a selectable level of electrical charge, the electrical charge controlling the amount of current flowing through the junction for a given reading voltage. A method for using a memristive device includes: applying a first voltage across a memristive junction, the memristive junction including a semiconductor matrix and particles embedded in the semiconductor matrix; electrical charges introduced into the semiconductor matrix by the first programming voltage being trapped within the particles; applying a reading voltage across the memristive junction; and measuring a current across the junction, the current being reduced proportionally to the electrical charges trapped within the potential wells, the current being used to determine a state of the junction.

20 Claims, 6 Drawing Sheets

(56) References Cited

U.S. PATENT DOCUMENTS

| | | | |
|---|---|---|---|
| 7,985,962 B2* | 7/2011 | Bratkovski et al. | 257/4 |
| 8,144,498 B2* | 3/2012 | Kumar et al. | 365/148 |
| 8,183,554 B2* | 5/2012 | Mouttet | 257/9 |
| 8,188,466 B2* | 5/2012 | Kawano et al. | 257/43 |
| 8,304,754 B2* | 11/2012 | Sekar et al. | 257/4 |
| 2003/0173612 A1* | 9/2003 | Krieger et al. | 257/304 |
| 2005/0122775 A1* | 6/2005 | Koyanagi et al. | 365/185.11 |
| 2007/0178643 A1* | 8/2007 | Forbes et al. | 438/257 |
| 2008/0001172 A1* | 1/2008 | Karg et al. | 257/194 |
| 2008/0079029 A1* | 4/2008 | Williams | 257/213 |
| 2008/0090337 A1* | 4/2008 | Williams | 438/133 |
| 2008/0128786 A1* | 6/2008 | Kim et al. | 257/321 |
| 2011/0121359 A1* | 5/2011 | Yang et al. | 257/109 |
| 2011/0182107 A1* | 7/2011 | Wu et al. | 365/148 |
| 2011/0188294 A1* | 8/2011 | Strachan et al. | 365/148 |

OTHER PUBLICATIONS

Sakamoto, Toshitsugu et al.; "NanoBridge Technology for Reconfigurable LSI"; NEC Technical Journal; 2007; 72-75; vol. 2; No. 1.

* cited by examiner

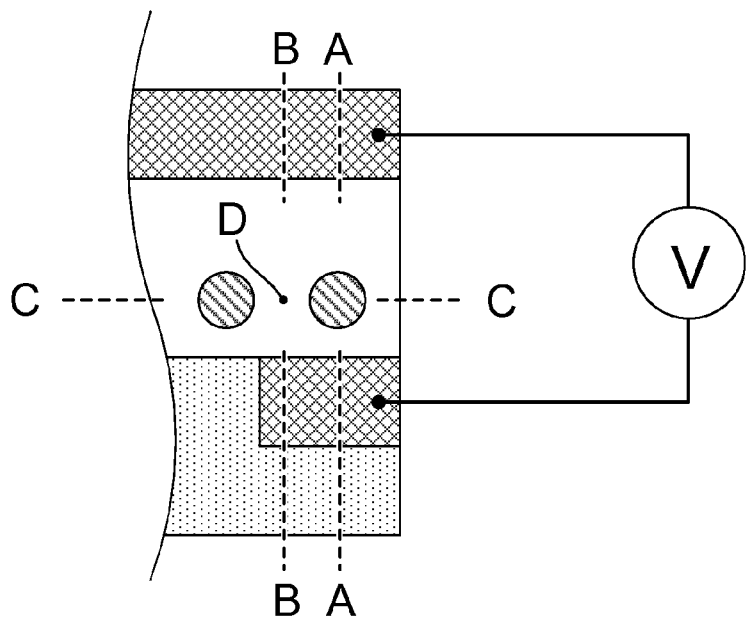
Fig. 3A
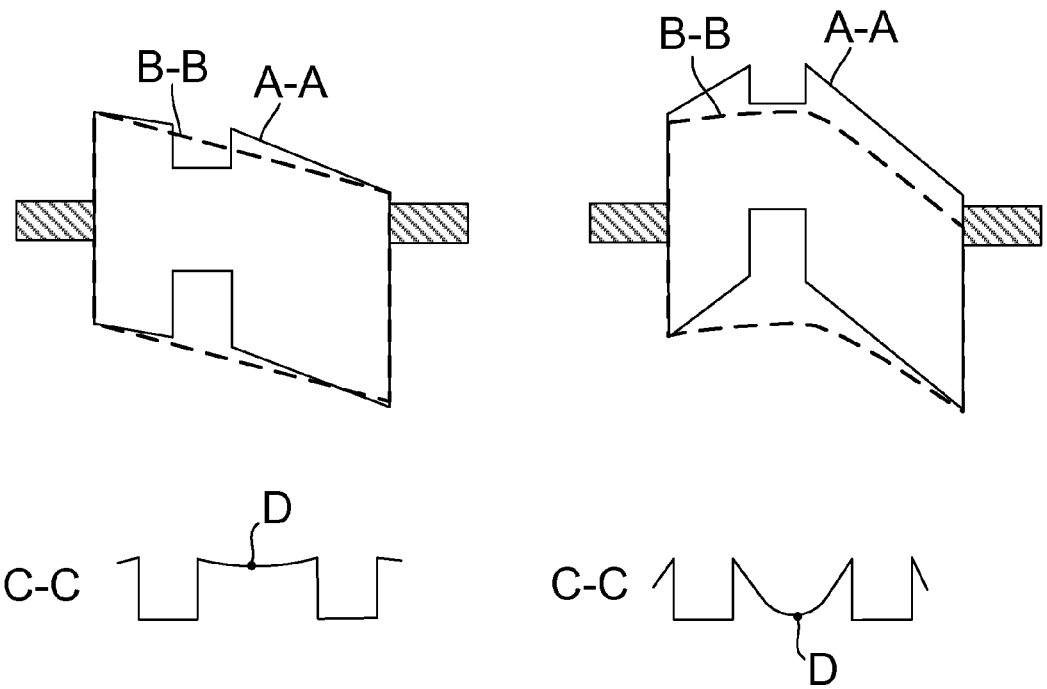
Fig. 3B  Fig. 3C

MEMRISTIVE DEVICE BASED ON CURRENT MODULATION BY TRAPPED CHARGES

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field. Typically changing dopant configurations within a matrix are exhibited as changes in the electrical resistance of the device.

Electrical devices that exhibit this "memory" of past electrical conditions through dopant based changes in electrical resistance have been called "memristors" or "memristive devices." Memristive behavior is most strongly evident in nanometer scale devices and could potentially be used for high density data storage, circuit calibration, or to model biological processes such as nerve synapses.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 3A-3C are diagrams illustrating the operation of a memristive device based on current modulation by trapped charges, according to one embodiment of principles described herein.

Throughout the drawings, identical reference numbers designate similar, but not necessarily identical, elements.

DETAILED DESCRIPTION

Figure 1A:
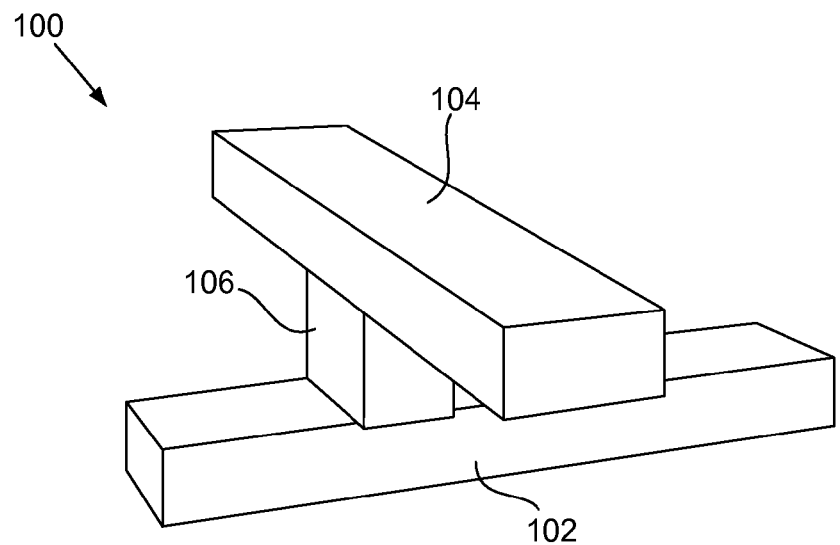
FIG. 1A is a perspective view of an illustrative memristive device which uses a memristive junction to selectively connect two crossing conductors, according to one embodiment of principles described herein.

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Other examples may include: switching devices, self programming circuit elements, memory devices capable of multi-state storage; solid state elements which can be used to tune circuits, analog neuronal computing devices which share fundamental functionalities with the human brain; and electronic devices for applying fuzzy logic processes.

Throughout the specification and appended claims, the term "memristor" or "memristive" is used to describe electrical devices which retain a of past electrical conditions through electrical charges that are trapped within the device. These charges are trapped through the application of a programming electrical field or voltage. After removal of the programming electrical field or voltage, the charges remain trapped over relatively long time scales. In some embodiments, this memristive effect may be most strongly evident in nanometer scale devices.

According to one illustrative embodiment, a memristive device may be formed by creating a junction between two electrical conductors. The junction is made up of a semiconductor matrix with a number of embedded particles. The embedded particles form potential wells which trap electrical charges when a programming electrical voltage is applied across the device. These trapped charges form a "memory" of past programming electrical voltages. Higher programming voltages result in a higher electrical charge being trapped in the particles. A reading voltage, which is lower than the programming voltage, can be used to sense the number of trapped charges in the junction without disturbing the condition of the junction. The reading voltage is applied across the junction. The electrical current which passes through junction directly depends on the electrical charge of the particles. When the particles have a relatively low charge, they allow a relatively large current to pass through the junction for a given reading voltage. When the particles have so a relatively high charge, they allow a relatively small current to pass through the junction for a given reading voltage. In this manner, the memristive device retains a memory of past programming devices and can be read multiple times without disturbing the condition of the junction.

These memristive devices based on current modulation by trapped charges have a number of advantages and can be used in a number of configurations. One advantage is that the materials and processes for constructing the device could be compatible with conventional semiconductor materials and processes with very little modification. Another advantage is that the charges are stable within the device over long time periods, allowing the junction to be programmed and then read many times without the requirement for electrical power to maintain the state of the junction. This allows for computing devices to "remember" their past configuration and be ready to operate the instant they are turned on. Additionally when coupled with a crossbar architecture, the memristive device can form the basis for solid state memory that has high storage density, no power requirement for long term data retention, and fast access times.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction. The term "self-assembled" as used herein refers to a system that naturally adopts some geometric pattern because of the identity of the components of the system; the system achieves at least a local minimum in its energy by adopting this configuration. Micron-scale dimensions refer to dimensions that range from 1 micrometer to a few micrometers in size. Sub-micron scale dimensions refer to dimensions that range from 1 micrometer down to 0.04 micrometers. Nanometer scale dimensions refer to dimensions that range from 0.1 nanometers to 50 nanometers (0.05 micrometers). Micron-scale and submicron-scale wires refer to rod or ribbon shaped conductors or semiconductors with widths or diameters having the dimensions of 0.04 to 10 micrometers, heights that can range from a few nanometers to a micrometer, and lengths of several micrometers and longer. A crossbar is an array of switches that can connect each wire in one set of parallel wires to every member of a second set of parallel wires that intersects the first set (usually the two sets of wires are perpendicular to each other, but this is not a necessary condition). As used herein, the functional dimension of the device is measured in 20 nanometers (typically less than 50 nm), but the lateral dimensions may be nanometers, sub-microns or microns.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1A illustrates an example of a memristive device (100) which connects two different crossed wires (102, 104). The memristive device (100) includes a junction (106) that may be comprised of a variety of materials, layers and geometries. According to one illustrative embodiment, the junction (106) has memristive characteristics including an electrical resistance which is programmable by applying a programming voltage bias across the wires (102, 104). By minimizing the electrical resistance, the junction (106) forms an electrical connection between the first wire (102) and second wire (104) and is in the "ON" state. When the electrical resistance of the junction (106) is maximized, the current flow between the two conductors (102, 104) is substantially reduced and the junction is in the "OFF" state. In some embodiments, the junction can have a number of intermediate states in which the resistance of the junction is in between a maximum and a minimum resistance value.

Figure 1B:
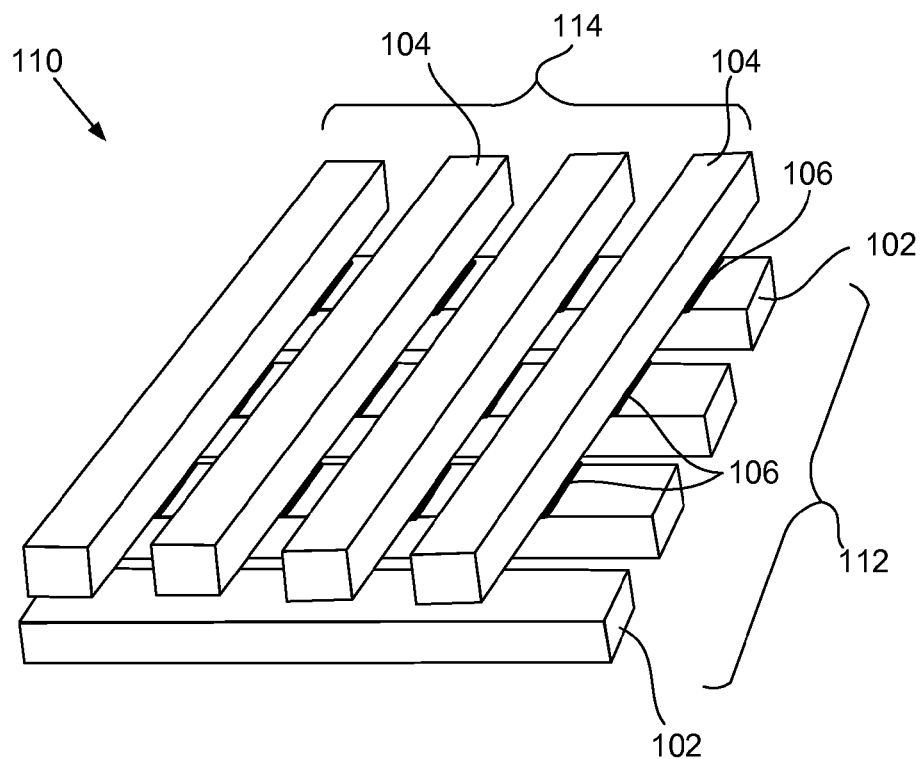
FIG. 1B is a perspective diagram of an illustrative crossbar architecture which uses memristive junctions between intersecting conductors, according to one embodiment of principles described herein.

FIG. 1B illustrates a crossbar array (110) employing a plurality of the memristive devices (100) shown in FIG. 1A. As shown in FIG. 1B, a first layer (112) of approximately parallel wires (102) is overlain by a second layer (114) of approximately parallel wires (104). The second layer (114) is roughly perpendicular, in orientation, to the wires of the first layer (112), although the orientation angle between the layers may vary. The two layers of wires form a lattice, or crossbar, each wire (104) of the second layer (114) overlying all of the wires (102) of the first layer (112) and coming into close contact with each wire (104) of the first layer (112) at wire intersections that represent the closest contact between two wires. The junction (106) is shown disposed between wires (102, 104). Only three of the junctions (106) are labeled, so as not to clutter the drawing; it will be appreciated that a junction (106) can be formed at each intersection of a wire (102) with a wire (104). Such crossbars may be fabricated from micron-, submicron- or nanoscale-wires, depending on the application.

Although individual wires (102, 104) in FIGS. 1A and 1B are shown with square or rectangular cross-sections, wires can also have circular, elliptical, or more complex cross-sections. The wires may also have many different widths or diameters and aspect ratios or eccentricities. The term "nanowire crossbar" may refer to crossbars having one or more layers of sub-microscale wires, microscale wires or wires with larger dimensions, in addition to nanowires.

Figure 2A:
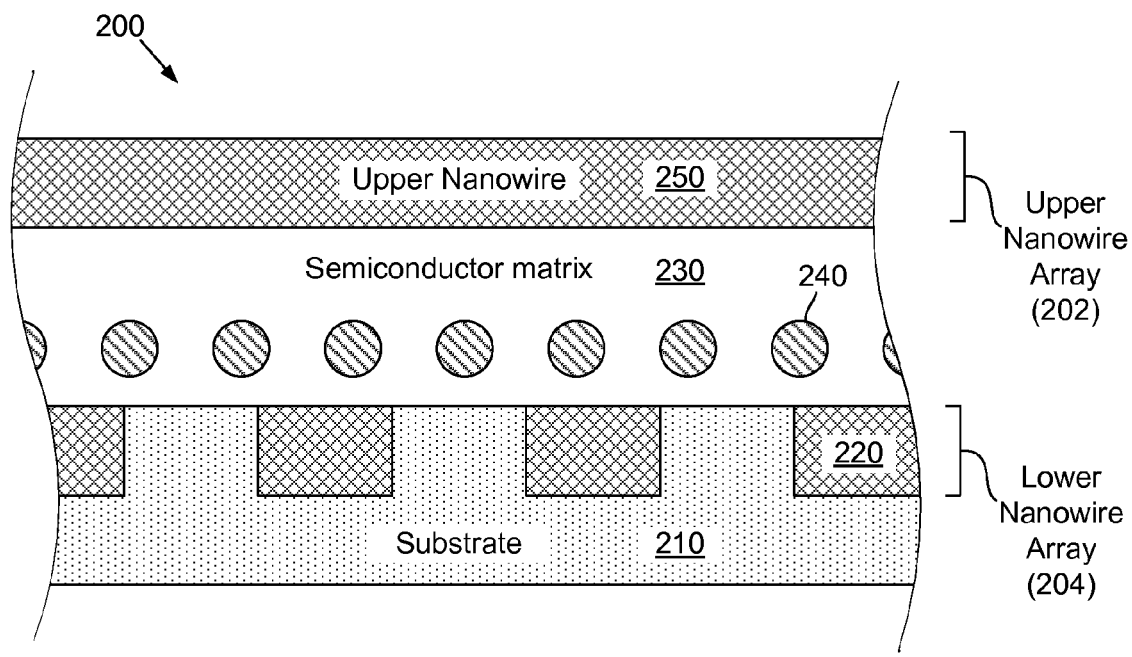
FIGS. 2A and 2B are cross-sectional diagrams of a memristive device, according to one embodiment of principles described herein.
Figure 2B:
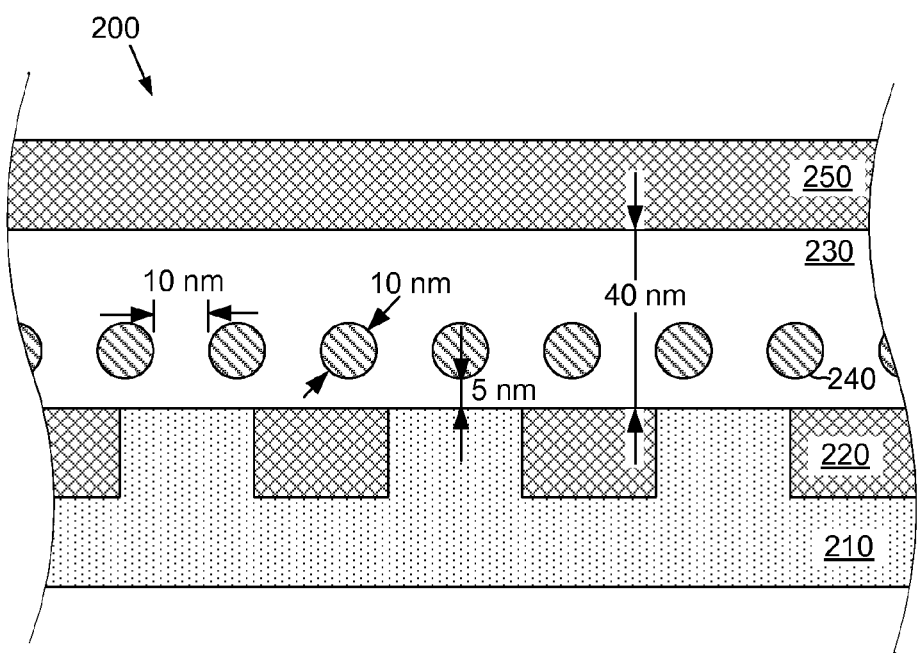

FIGS. 2A and 2B are cross-sectional diagrams of an illustrative memristor device (200) which uses a crossbar array with a memristive junction between intersections of the upper nanowire wires and lower nanowires. FIG. 2A shows a substrate (210) with a number of embedded nanowire conductors (220) which make up the lower nanowire array (204). The cross-section shown in FIG. 2A cuts across the width of the lower nanowires (220) and across the length of an upper nanowire (250).

On top of the substrate (210) and lower nanowire array (204) a semiconductor matrix (230) is deposited. Embedded in the semiconductor matrix (230) are a number of particles (240). The semiconductor matrix (230) may be formed from any of a number of materials, depending on the desired performance of the memristive device (200). By way of example and not limitation, the semi-conductor matrix (230) may be made up of one or more of the following semiconductors: silicon, other group IV elements or compounds, metal oxides, group III-V semiconductors, group II-VI semiconductors, layered semiconductors, organic semiconductors, or other suitable materials.

According to one illustrative embodiment, the semiconductor matrix (230) is made up of a wide or medium band gap semiconductor which is capable of forming an ohmic junction with a first electrode and a Schottky barrier at an interface with a second electrode. This may require that the semiconductor matrix (230) be selected based on the work functions of the electrodes and have a doping profile which changes through its thickness. In the illustrative embodiment shown in FIG. 2A, the wires within the upper and lower nanowire arrays (202, 204) serve not only as an addressing system for the memristive device, but as the electrodes.

The embedded particles (240) are designed to be potential wells within the semiconductor matrix (230). To form a potential well, the embedded particles (240) must have a band offset with respect to the semiconductor matrix (230) which is large enough that the electrical charges will not tunnel back into the matrix. Additionally, it can be desirable that the particles (240) form a reproducible and repeatable interface with the semiconductor matrix (230 such that the band alignments between the particles (240) and semiconductor matrix (230) are contained within a small range. This could provide an array of memristive devices with more consistent characteristics.

Additionally, to improve the performance of the memristive device, it may be desirable for the particles (240) to have a uniform size and geometry. For example, particles of uniform size and geometry react similarly when external forces are applied, producing memristive devices with more uniform characteristics. Further, the particles may have external surfaces which are relatively smooth to prevent the escape of charges trapped within the particles at discontinuities such as edges, corners, or other protrusions. For example, a spherical geometry may be preferred to reduce the undesirable loss of charges. As used in the specification and appended claims, when the term "smooth external surface" is used to refer to a particle, the particle has an external geometry such that there is less than a 20% Root Mean Square (RMS) variation in the electrical field compared to the ideal shape. In some embodiments, particles having less than a 10% RMS variation in the electrical field compared to the ideal shape.

FIG. 2B shows one illustrative embodiment of the memristive device which includes a several illustrative dimensions. According to this illustrative embodiment, the semiconductor matrix (230) is 40 nanometers in thickness with 10 nanometer diameter spherical particles (240) embedded 5 nanometers above the bottom surface of the semiconductor matrix (230). The spherical particles (240) are spaced 10 nanometers apart.

Diameter and spacing of the particles influences the operation of the device. According to one illustrative embodiment, a relatively large number of particles (240) are present between intersections of each of the lower wires (220) and the upper wires (250). A relatively large number of particles (240) at each intersection could provide increased uniformity in the characteristics of the various junctions. For example, ten or more particles within each junction may be a large enough number of particles to provide the desired uniformity. For purposes of illustration, FIGS. 2A and 2B show only a few particles at each intersection.

Additionally, to improve uniformity in the characteristics of the various junctions, particles (240) could be arranged with regular spacing and density in the semiconductor matrix (230). According to one illustrative embodiment, the two dimensional array of particles (240) may be self-assembling. For example, during the manufacturing process, the particles (240) may be electrically charged prior to dispensing them onto a surface. The particles (240) will then mutually repel each other, thereby forming a relatively uniform and regular spacing. Additionally or alternatively, the particles (240) may be grown from a template, formed using photolithographic techniques, imprinting, or by other methods.

FIGS. 3A-3C illustrate the principles underlying operation of the memristive device. FIG. 3A shows a cut away view of the memristive device illustrated in FIGS. 2A and 2B. A voltage being applied across a memristive junction and the resulting electrical potential profiles are shown through three cross-sections: A-A, B-B, and C-C. FIGS. 3B and 3C are illustrative graphs of potential profiles along the three cross-sections. FIG. 3B contains cross-sections of potential profiles when there are no substantial charges trapped within the spherical particles. The section A-A passes through the thickness of the semiconductor matrix and directly through the center of a spherical particle. The electrical potential through the A-A cross-section is illustrated as a solid line and labeled "A-A." The materials above and below the cross-section of the semiconductor matrix are illustrated as boxes to the right and left, respectively, of the potential profiles. As can be seen from the potential profile A-A, the lower surface of the semiconductor material (on the left of the profile) has a significant jump in electrical potential when compared with the adjoining material. This represents a Schottky barrier that is created by the material and doping differences at the interface of the two materials. Moving to the right on the profile A-A, a rectangular indentation represents the decrease in electrical potential (a potential well) that occurs within the interior of the spherical particle. The profile A-A continues to slope downward and to the right until the potential line intersects the material to the right (the upper nanowire). At this interface, there is no significant discontinuity in the electrical potential at the interface. This represents the ohmic contact between the upper surface of the semiconductor and the upper nanowire.

Continuing to the next profile illustrated in FIG. 3B, the potential profile B-B represents the potential gradient in a cross-section of the semiconductor material that passes between the two adjacent spherical particles. The profile B-B exhibits a similar Schottky barrier on the left interface and decreases linearly to the ohmic interface between the upper surface of the semiconductor material and the lower surface of the upper electrode. Because the profile B-B does not intersect the spherical particles and the spherical particles are not charged, the profile B-B is not deviate as it passes through the region between the particles.

Profile C-C shows a horizontal potential profile which passes horizontally through the spherical particles. The profile C-C shows several rectangular depressions in the potential profile which correspond to electrical minima (potential wells) which occur within the spherical particles. The potential profile between the two spherical particles is nearly straight but exhibits a slight downward bow at point D.

The potential wells formed within the particles are local minima that tend to trap electrical charges that are present in the semiconductor matrix. FIG. 3C illustrates the effect on the potential profiles when charges become trapped within the potential wells. In FIG. 3C, the potential profile A-A bows upward as a result of charges trapped in the potential wells. The interior of the particles still represent local minima in the potential field and are capable of stably storing an electrical charge. However, the influence of the charges has altered the profiles such that the electrical resistance between the upper and lower nanowires is increased. Profile B-B shows a significant upward bow in the area which is influenced by the charged particles. Increasing the number of charges in trapped within the particle results in a corresponding increase in the effective resistance of the junction between the two nanowires. In effect, the negatively charged particles repulse electrons attempting to flow across the junction from either the upper nanowire or lower nanowire. As in FIG. 3B, section C-C illustrates potential profile along a horizontal cross-section which passes through the center of the spherical particles.

Electrical charges can be forced into potential wells by applying a voltage across the junction between the lower nanowire and the upper nanowire. For example, to address a specific junction, a first voltage would be applied to the upper nanowire and a second voltage may be applied to the lower nanowire. Only at the junction where the two wires intersect is the voltage bias significant enough to force a significant number of electrons through the semiconductor and into the particles. The charges remain trapped within the particles over long periods of time. After programming the particles within the junction, a lower reading voltage may be applied across the junction in a similar manner. The lower reading voltage is not significant enough into introduce more charges into the particles. In part, the state of the device is not disturbed by lower voltages since the potential in the saddle point at point D changes at slower rate as compared to the potential of the wells. Instead a small current passes across the junction which is proportional to the electrical resistance of the junction. As stated above, the electrical resistance of the junction is directly influenced by the number of charges trapped within the particles. Consequently, by measuring the amount of current which passes through the junction when a reading voltage is applied, the amount charge within the particles can be determined.

Figure 4:
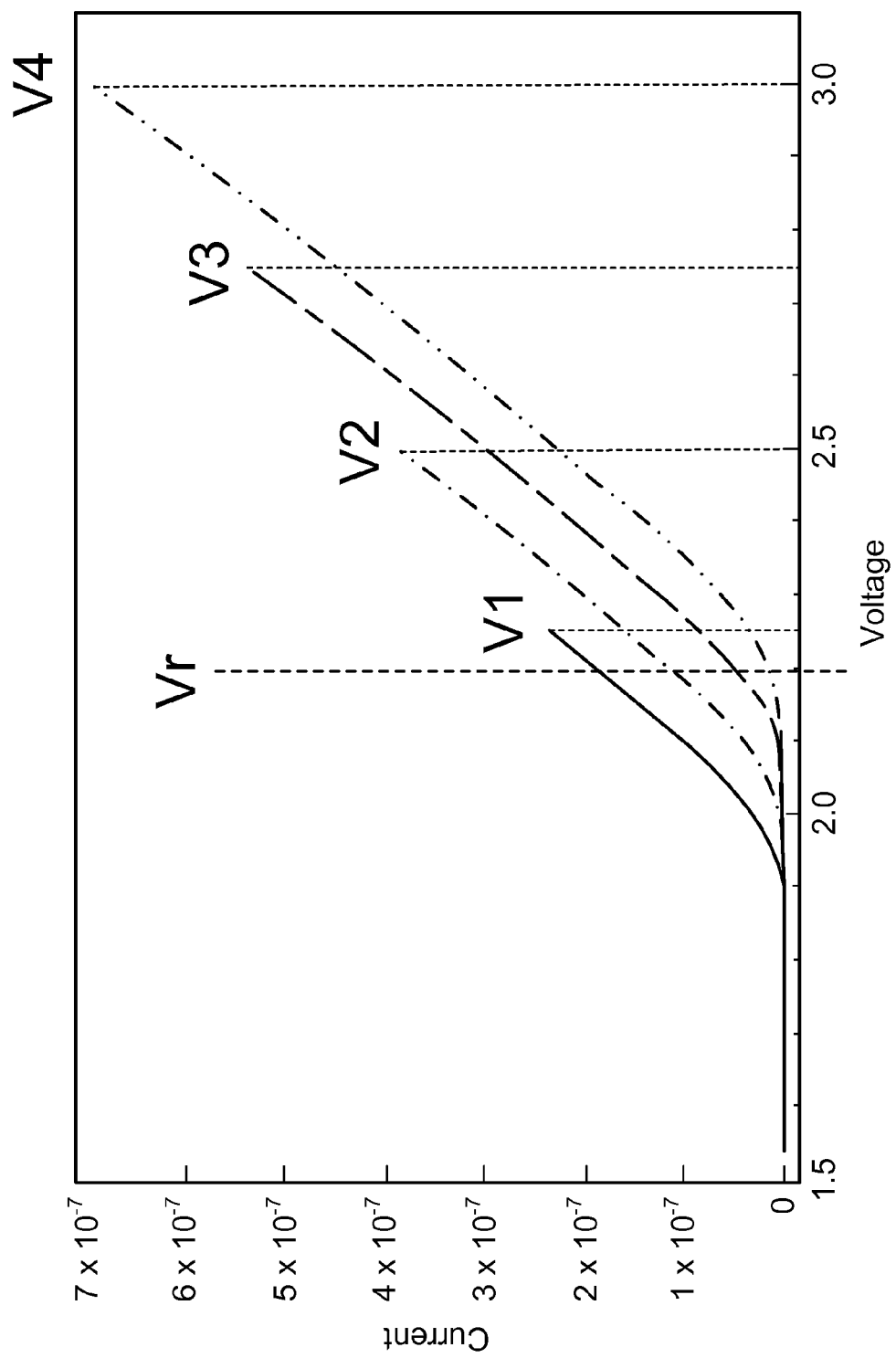
FIG. 4 is a graph which illustrates relationships between voltages applied across a memristive device and current passed through the memristive device, according to one embodiment of principles described herein.

FIG. 4 shows an illustrative graph of the relationship between various amounts of charges trapped within the particles and the resistance of the junction. The vertical axis of the graph represents currents in amperes that pass through the junction for a given sensing voltage, beginning at the origin with zero volts and increasing to $7\times10^{-7}$ amperes at the top of the graph. The horizontal axis represents voltage applied at the junction, with lower voltages on the left of the graph and higher voltages to the right of the graph.

According to one illustrative embodiment, the junction may have two or more states. For example, a first state may correspond to a condition when there are no charges trapped within the particles, a second state may correspond to the number of charges which are trapped as a result of the application of a first programming voltage (V1) across the junction, a third state may correspond to the number of charges which are trapped as a result of the application of a second programming voltage (V2) across the junction, and so forth. Increasing programming voltages lead to an increased number of charges being trapped within the particles and additional distortion of the electrical potential profiles. As long as the reading voltage (Vr) is less than the last programming voltage applied, the reading voltage (Vr) will not force a significant number of additional electrons into the potential wells created by the particles.

In FIG. 4, a first programming voltage (V1) of approximately 2.25 volts has been applied across a memristive junction. The solid line represents the amount of current that will pass through the junction when a reading voltage is applied. For example, a reading voltage below about 1.9 volts will not result in any significant current flowing through the junction. Above 1.9 volts the current through the junction increases as the reading voltage increases. In FIG. 4, a reading voltage (Vr) of approximately 2.2 volts has been applied. For a programming voltage of 2.25 volts (V1) the current through the junction would be approximately $2\times10^{-7}$ amps.

As the programming voltages increase, the electrical resistance of the junction increases and the current for a given reading voltage decreases. For example, for a programming voltage of 2.5 volts (V2) and a reading voltage of 2.2 volts (Vr), the expected current through the junction would be approximately $1.1\times10^{-7}$ amps. For a programming voltage of 2.75 volts (V3) and a reading voltage of 2.2 volts (Vr), the expected current would be approximately $0.3\times10^{-7}$ volts. For a programming voltage of 3 volts (V4) and a reading voltage of 2.2 volts (Vr), the expected current could be very small but still practical, e.g. for neuromorphic applications in which desirable resistance is in the range 10^6 to 10^10 Ohms (or, equivalently current in the range of micro to hundreds of pica amperes). This indicates that the electrical charges trapped within the particles as a result of the 3 volt programming voltage (V4) repulse the vast majority of the electrons from the 2.2 volt reading voltage (Vr). Consequently, for a reading voltage of 2.2 volts (Vr) at least four distinct states could be determined which correspond to programming voltages V1, V2, V3, and V4.

The numeric examples given above are merely examples used to illustrate the operational principles of a memristive device based on current modulation of trapped charges. The actual performance of the memristive device could depend on a number of factors. The selection of materials and geometry within the junction can significantly alter the relationship between the programming voltage and the resulting current at a programming voltage. For example, the number, size and spacing of the particles within the junction can influence the electrical performance of the junction.

Properties of the memristive device include the ability to change the resistance of the junction continuously without requiring dopant or ion motion. Consequently, the memristive device may be particularly suitable for integration into cross-bar neuromophic-like networks.

Figure 5:
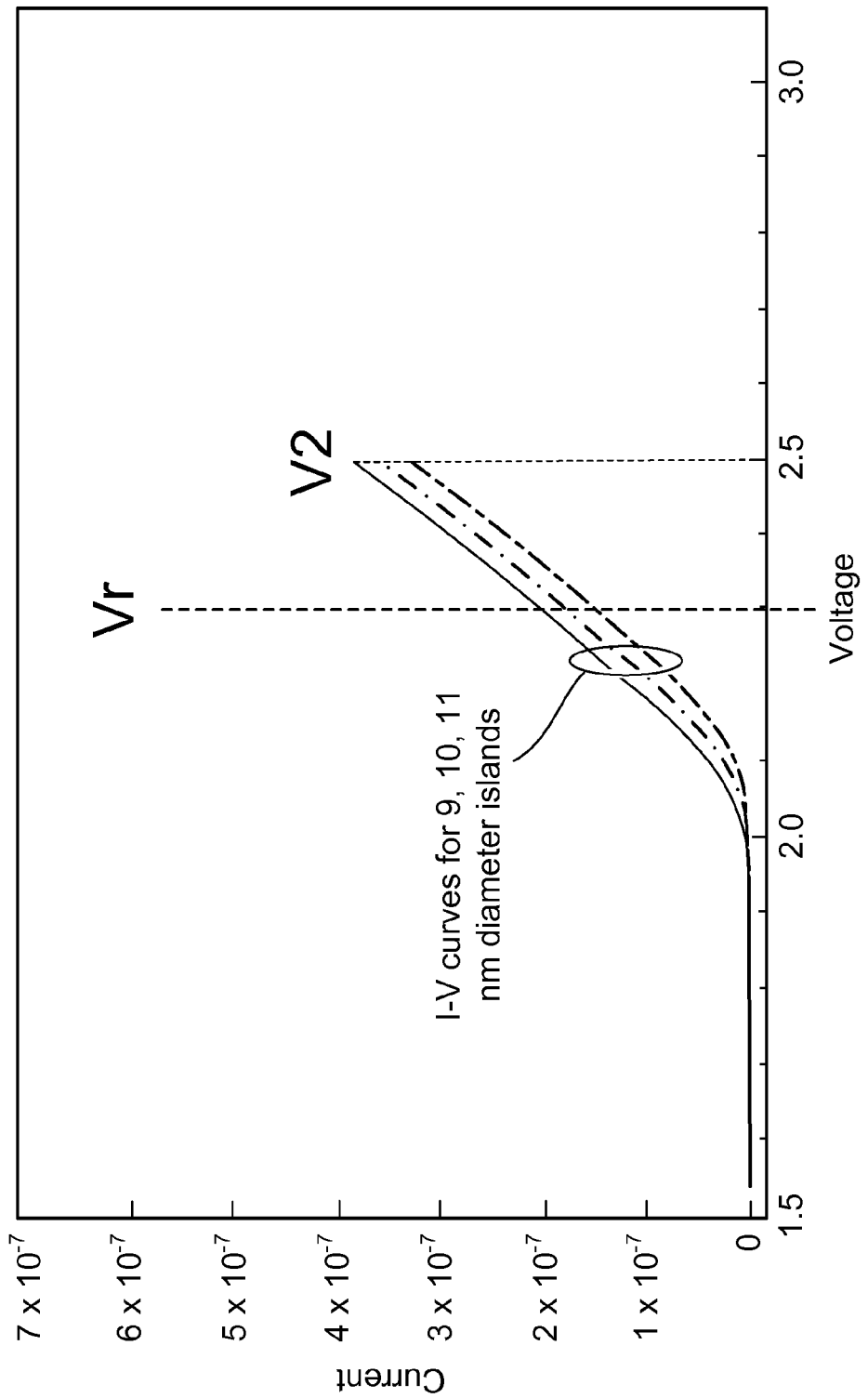
FIG. 5 is a graph which illustrates relationships between voltages applied across a memristive device and currents passed through the memristive device as a function of particle size, according to one embodiment of principles described herein.

FIG. 5 illustrates the effect of changing particle size within the junction. In FIG. 5 junctions that contain 9 nanometer, 10 nanometer, and 11 nanometer diameter particles are compared. All other variables are assumed to be identical. The upper solid line represents the current curve of a junction containing 9 nanometer particles. The center dash-dot line and lower dashed line represent the resistance curves of 10 nanometer and 11 nanometer particles respectively. As can be seen from the chart, larger particulate sizes correspond to lower currents for a given reading voltage.

A number of other parameters may be controlled to achieve the desired current curves. For example, the electrode materials, semiconductor matrix material, particle material, particle geometry, particle diameter, particle spacing, and particle location within the matrix material could all be parameters which can be adjusted to achieve a desired profile.

Figure 6:
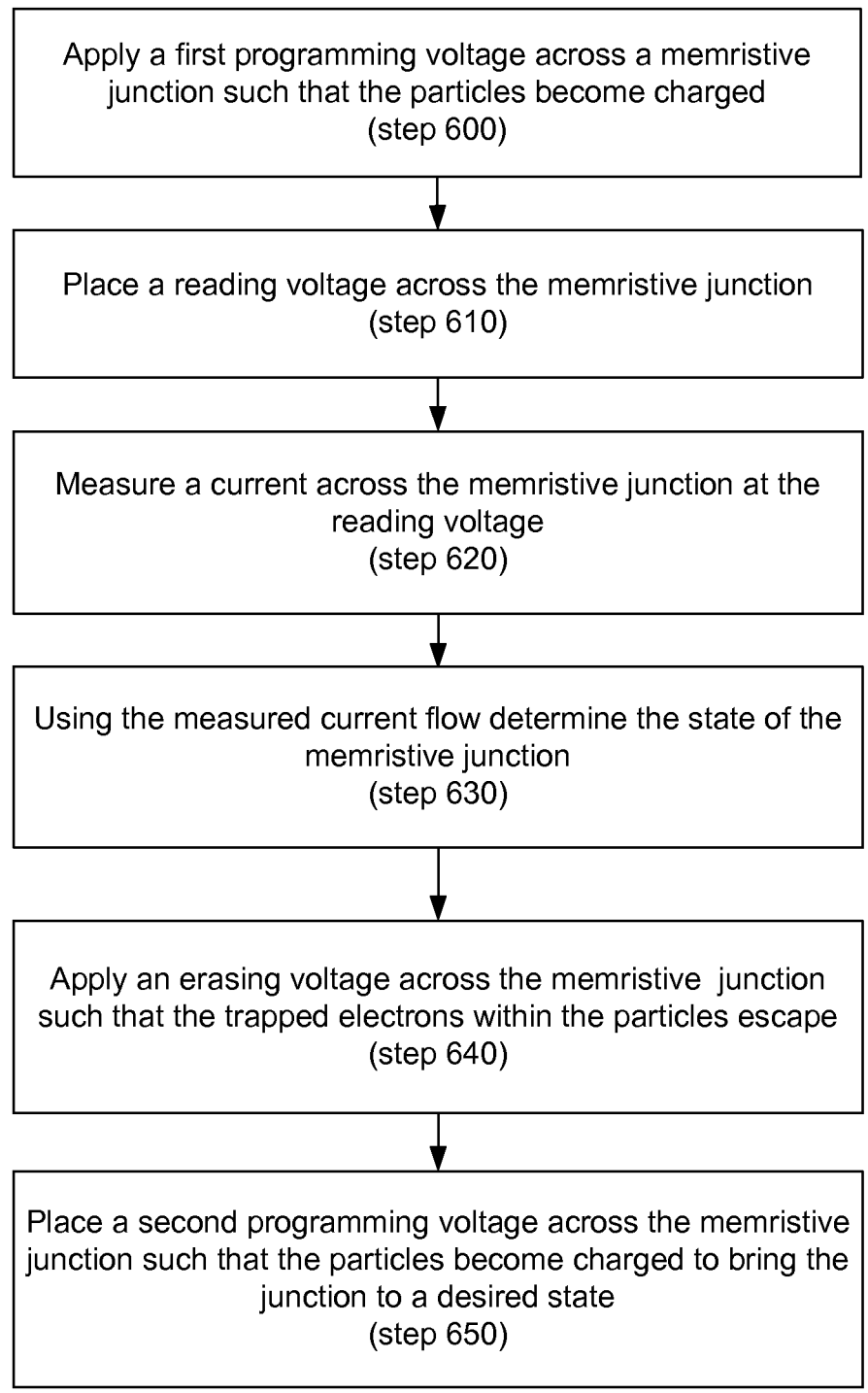
FIG. 6 is a flowchart showing one illustrative method for using a memristive device based on current modulation by trapped charges, according to one embodiment of principles described herein.

FIG. 6 is a flowchart which illustrates one illustrative method for utilizing a memristive device. In a first step, a first programming voltage is applied across an intersection which contains a memristive junction such that particles embedded in a semiconductor matrix become charged (step 600). The programming voltage is removed after a suitable duration. The charges forced into the potential wells created by the particles in the memristive junction remain trapped over long time periods. A reading voltage can then be applied across the junction (step 610). The current flowing through the junction at the reading voltage is then measured (step 620). Using the measured amount of current flow, the state of the junction could be determined (step 630). The reading step can be repeated any number of times without affecting the number of charges trapped within the particles so long as the reading voltage is a suitably lower voltage than the programming voltage.

The state of the junction can be changed to increasingly higher resistances by applying increasingly higher programming voltages. To change the state of the junction to a lower resistance, ah erasing voltage is applied across the junction such that substantially all of the trapped electrons escape from the potential wells created by the particles. For example, an erasing voltage may be a relatively large voltage bias across the junction of the opposite polarity of the programming voltage (step 640). Without subscribing to any particularly theory, this erasing voltage may distort the electrical potential such that local minima are no longer formed by the particles. According to one illustrative embodiment, the erase process need only remove enough charge to make the junction more conductive than a nominally most conductive state produced by the lowest writing voltage used in the device. Consequently, a precise knowledge of how much charge is removed may not be required. This could significantly decrease the erase time of the device or an array of devices. After removal of the erasing voltage, the junction is returned to its uncharged state and a second programming voltage can be applied across the junction to bring it to the desired state (step 650).

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive device comprising:
a first electrode;
a second electrode; and a junction, said junction being interposed between said first electrode and said second electrode, said junction comprising:
a semiconductor matrix; and
particles embedded in said semiconductor matrix, said particles each comprising a potential well configured to hold a selectable level of electrical charge, wherein a quantity of said particles in said semiconductor matrix is sufficient that said electrical charge held in said particles governs and promotes a uniform electrical resistance of a path between said first and second electrodes through said semiconductor matrix, and an amount of current flowing through said junction for a given reading voltage,
wherein said quantity of particles is configured such that a programming voltage applied will set the electrical resistance of said path, which resistance will remain unchanged in response to the reading voltage less than the programming voltage and will remain unchanged until said electrical charge is discharged or a second, greater programming voltage is applied.

2. The device of claim 1, wherein said particles are both electrically charged and are potential wells for trapping and holding additional electrical charge present in said matrix.

3. The device of claim 1, wherein said selectable level of electrical charge is applied by applying a programming voltage bias across said first electrode and said second electrode.

4. The device of claim 1, wherein said electrodes are conductors within a crossbar array.

5. The device of claim 4, wherein said memristive device is a data storage memory device.

6. A memristive device comprising:
a first electrode;
a second electrode; and
a junction, said junction being interposed between said first electrode and said second electrode, said junction comprising:
a semiconductor matrix; and
particles embedded in said semiconductor matrix, said particles each comprising a potential well configured to hold a selectable level of electrical charge, said electrical charge controlling the amount of current flowing through said junction for a given reading voltage;
wherein said junction is configured to have at least three distinct states, said three distinct states corresponding to application of two different programming voltages across said junction.

7. The device of claim 6, wherein said particles are substantially uniform in size and shape.

8. The device of claim 6, wherein said particles are substantially spherical.

9. The device of claim 6, wherein said particles have a substantially repeatable and reproducible interface with said semiconductor matrix.

10. The device of claim 6, wherein said particles have a regular arrangement in said semiconductor matrix.

11. The device of claim 6, wherein said semiconductor matrix forms an ohmic contact with said first electrode and a Schottky barrier with said second electrode.

12. A cross-bar array comprising a plurality of memristive devices of claim 6.

13. A method for using a memristive device comprises:
applying a first programming voltage across a memristive junction, the memristive junction comprising a semiconductor matrix and particles embedded within said semiconductor matrix such that said particles create potential wells within said semiconductor matrix, electrical charges introduced into said semiconductor matrix by said first programming voltage being trapped within said potential wells;
applying a reading voltage across said memristive junction, said reading voltage having a lower magnitude than said first programming voltage such that additional electrical charges are not trapped by said potential wells; and
measuring a current across said junction, said current being reduced proportionally to the electrical charges trapped within said potential wells, said current being used to determine a state of said junction.

14. The method of claim 13, further comprising: applying an erasing voltage across said junction such that trapped electrical charges within said potential wells escape from said potential wells.

15. The method of claim 13, further comprising applying a second programming voltage across said junction, said second programming voltage introducing additional electrical charges into said semiconductor matrix, a portion of said additional electrical charges being trapped in said potential well.

16. The device of claim 6, where said particles are charged with a like electric charge so that mutual repulsion promotes even distribution of said particles.

17. The device of claim 1, wherein said particles have a band offset with respect to the semiconductor matrix that prevents trapped electrical charges from tunneling from the particle back into the matrix.

18. The device of claim 6, wherein said particles are not mobile within said matrix.

19. The device of claim 18, wherein said particles are formed in place using any of growth from a template, photolithography or imprinting.

20. The method of claim 13, wherein said particles are not mobile within said matrix, said method comprising forming said particles in place using any of growth from a template, photolithography or imprinting.

* * * * *